(12) United States Patent
van der Wagt

(10) Patent No.: US 6,703,907 B1
(45) Date of Patent: Mar. 9, 2004

(54) CIRCUIT TECHNIQUE FOR INCREASING EFFECTIVE INDUCTANCE OF DIFFERENTIAL TRANSMISSION LINES

(75) Inventor: Jan Paul Anthonie van der Wagt, Newbury Park, CA (US)

(73) Assignee: Inphi Corporation, Westlake Village, CA (US)

( * ) Notice: Subject to any disclaimer, the term of this patent is extended or adjusted under 35 U.S.C. 154(b) by 38 days.

(21) Appl. No.: 10/228,880

(22) Filed: Aug. 26, 2002

(51) Int. Cl.$^7$ ................................................ H01P 5/00
(52) U.S. Cl. ............................. 333/5; 333/238; 333/4
(58) Field of Search ................................. 333/5, 4, 161, 333/22 R, 12, 109, 238, 245, 246, 131

(56) References Cited

U.S. PATENT DOCUMENTS

| | | | | |
|---|---|---|---|---|
| 3,718,762 A | * | 2/1973 | Nezu et al. | 375/257 |
| 5,189,434 A | * | 2/1993 | Bell | 343/853 |
| 5,578,939 A | * | 11/1996 | Beers et al. | 326/30 |
| 6,396,359 B1 | * | 5/2002 | Hajimiri et al. | 331/96 |
| 6,529,085 B2 | * | 3/2003 | Hajimiri et al. | 331/96 |
| 6,600,451 B2 | * | 7/2003 | Mimura et al. | 343/741 |

OTHER PUBLICATIONS

Thomas H. Lee; The Design of CMOS Radio–Frequency Integrated Circuits "High–Frequency Amplifier Design"; Chapter 8, p. 178–191.

Richard E. Matick; Transmission Lines for Digital and Communication Networks; IEEE Press.

Mina Danesh; Differentially Driven Symmetric Microstrip Inductors; 2002 IEEE.

Herbert Knapp, Hans–Dieter, Martin Wurzer, Mira Rest; 256Hz Static Frequency Divider and 25 Gb/s Multiplexer in 0.12 $\mu$m.

Visual Supplement to the Digert of Technical Papers, vol. 45.

* cited by examiner

Primary Examiner—Brian Young
Assistant Examiner—John Nguyen
(74) Attorney, Agent, or Firm—Fernandez & Associates LLP

(57) ABSTRACT

An electronic apparatus with a high inductive reactance for differential signals per unit area and a small inductive reactance for common-mode signals relative to its inductive reactance for differential signals with predictable and scalable characteristics. This may be achieved by configuring transmission line pairs such that currents associated with the differential component of a source signal in the first and second transmission lines are aligned and currents associated with the common mode component of a source signal in the first and second transmission lines are counter-aligned. Advantageously, the current invention may be implemented using currently available technology and integrated into a variety of different devices such as broad-band and narrow-band amplifiers, high-speed logic gates, mixers, oscillators, wireless local area networks, global positioning systems and modern communication systems.

67 Claims, 11 Drawing Sheets

A first transmission line structure comprising one or more contiguous first transmission line segments is established (Step 500).

A first coupling position for coupling to a first electrical signal source module, or input, is established at or near the first end of the first transmission line structure (Step 510).

A second coupling position for coupling to a first electrical signal receiver module, or output, is established at or near the second end of the first transmission line structure (Step 520).

A second transmission line structure comprising one or more contiguous first transmission line segments is established adjacent to the first transmission line structure (Step 525).

A third coupling position for coupling to a second electrical signal receiver module, or output, is established at or near the first end of the second transmission line structure, adjacent to the first end of the first transmission line structure (Step 530).

A fourth coupling position for coupling to a second electrical signal source module, or input, is established at or near the second end of the second transmission line structure, adjacent to the second end of the first transmission line structure (Step 540).

Figure 8a

Optionally, a crossover module may be coupled to the current invention (Step 550).

Optionally, a first electrical signal source module may be coupled to the first transmission line structure at the first coupling position (Step 560).

Optionally, a first electrical signal receiver module may be coupled to the first transmission line structure at the second coupling position (Step 570).

Optionally, a second electrical signal receiver module may be coupled to the second transmission line structure at the third coupling position (Step 580).

Optionally, a second electrical signal source may be coupled to the second transmission line structure at the fourth coupling position (Step 590).

Figure 8b

CIRCUIT TECHNIQUE FOR INCREASING EFFECTIVE INDUCTANCE OF DIFFERENTIAL TRANSMISSION LINES

BACKGROUND INFORMATION

1. Field of the Invention

The current invention relates to the field of circuits and more particularly to the design and manufacture of transmission line pairs.

2. Description of Related Art

Typically, high-speed integrated circuits are designed and manufactured taking inductance effects into consideration. As electronic components such as amplifiers, oscillators, and mixers are designed to operate at higher and higher frequencies, managing inductance effects may become more important and more difficult. For many applications, it is preferable to reduce the number of external components and manage inductance effects with on-chip elements. Because inductive elements may be difficult to model accurately and may not scale simply in terms of desired inductance and physical layout dimension, transmission line structures may be used instead of pure inductive elements. FIG. 1 illustrates an example of a differential amplifier circuit using a transmission line pair (TLP) 58 in an example of a coupled coplanar strip line (CPS) configuration. In this example, transmission lines 60 and 65 are magnetically coupled. Arrows 62 and 68 indicate the direction of alternating currents (AC) and arrows 61 and 67 indicate the direction of direct currents (DC) that may exist when the differential amplifier circuit is operating. The counter-aligned AC currents form an odd-mode signal on the TLP. In this example, the voltages at a position along the length of the transmission lines 60 and 65 are of opposite sign for an odd-mode signal. The aligned DC currents form an even-mode signal on the TLP. The voltages at a position along the length of the transmission lines 60 and 65 are of the same sign for an even-mode signal. In this example, the differential AC output signal of the amplifier generates an odd-mode signal on the TLP. In this example, considering transmission lines shorter than one quarter of the operational signal wavelength (lambda or λ) to minimize the possibility of significant line losses and/or complex line behavior over different frequency bands, the net effect of the positive coupling of lines 60 and 65 is to reduce the inductive reactance seen by the differential signal at nodes 59 and 69 and raise the inductive reactance seen by the common mode signal at nodes 59 and 69. In this example, the differential signal may be represented as:

$$V1-V2$$

where V1 is output voltage 55 and V2 is output voltage 54. In this example, the common mode signal may be represented as:

$$(V1+V2)/2.$$

Lines 60 and 65 may also be electrostatically coupled. Typically, the mutual capacitance of lines 60 and 65 reduces the inductive reactance seen by both signal modes. Typically, the inductive reactance for the differential signal is reduced to a greater degree than that for the common mode signal.

Typically, the effect of both magnetic and electrostatic coupling of the lines 60 and 65 is therefore to reduce the inductive reactance seen by the differential signal relative to that seen by the common mode signal. It is often desired to have a large inductive reactance seen by the differential signal and a small inductive reactance seen by the common mode signal.

One technique for addressing this issue is to use uncoupled transmission lines or coplanar wave lines (CPW). For uncoupled transmission lines, the inductive reactance is the same for differential and common-mode excitations. For similar cross-sectional line geometries, the absence of coupling between CPW lines tends to result in a higher inductive reactance for the differential signal and a lower inductive reactance for the common-mode signal relative to the CPS lines. CPW lines may be implemented by effectively isolating the transmission lines from each other by introducing a ground plane between the transmission lines. This technique is useful when space is available. However, typical CPW layouts tend not to be as compact as CPS layouts and typically require constructing a larger structure to accommodate a ground plane and associated insulating layers.

Accordingly, it is desirable to have a device capable of producing a high effective inductance per unit layout area for differential signals and a low effective inductance per unit length for common-mode signals with predictable and scalable characteristics. Preferably, this device should support application in high-speed systems over a wide bandwidth and frequency range.

SUMMARY OF THE INVENTION

It is an object of the current invention to produce an electronic apparatus with a high inductive reactance for differential signals per unit area with predictable and scalable characteristics. It is also an object of the current invention to produce an electronic apparatus with a small inductive reactance for common-mode signals relative to its inductive reactance for differential signals. This is achieved by creating a TLP in a counter coupled coplanar strip line (CCPS) configuration. A simple TLP in a CCPS configuration may be implemented by aligning two transmission line structures substantially in parallel and coupling the transmission line structures with one or more appropriate electrical signal sources and one or more electrical signal receivers such that when a signal is applied, the currents associated with the differential component of the source signal in the first transmission line structure and the second transmission line structure are aligned and the currents associated with the common mode component of the source signal in the first transmission line structure and the second transmission line structure are counter-aligned. In this case, the differential component of the output signal of the amplifier substantially generates an even mode signal on the TLP. This CCPS configuration tends to establish a high inductive reactance for the differential component of the source signal and a low inductive reactance for the common-mode component of the source signal.

According to a simple embodiment of the current invention, the transmission lines are substantially parallel, substantially straight and implemented in the same plane resulting in a structure with predictable and scalable properties. However, alternate embodiments of the current invention may comprise more complex transmission line structures. For example, various embodiments of the current invention may be implemented partially or wholly in different planes and/or have a large or small radius of curvature and/or be nearly, but not exactly, parallel. According to an alternate embodiment of the current invention, the transmission line structures may have a circular layout configuration.

According to a preferred embodiment of the current invention, a high degree of symmetry may be maintained in the transmission line structures. Preferably, the transmission lines structures may comprise substantially straight and parallel lines in the same plane with an out-of-plane crossover structure wherein some portion of the first transmission line structure crosses over, under or around some portion of the second transmission line structure.

Advantageously, the current invention may be designed and built using currently available technology and integrated into a variety of different devices such as, but not limited to, broad-band amplifiers, high-speed logic gates, narrow-band amplifiers, mixers, oscillators, wireless local area networks, satellite communications devices, global positioning systems and high-speed communication systems. Optionally, according to the current invention, a transmission line structure pair in the CCPS configuration may be implemented as an integrated circuit chip as a separate component or integrated with one or more other electronic elements.

BRIEF DESCRIPTION OF THE DRAWINGS

FIGS. 8a and b illustrate a preferred process according to the current invention for increasing the effective inductance of transmission lines.

DETAILED DESCRIPTION OF PREFERRED EMBODIMENTS

Figure 2A:
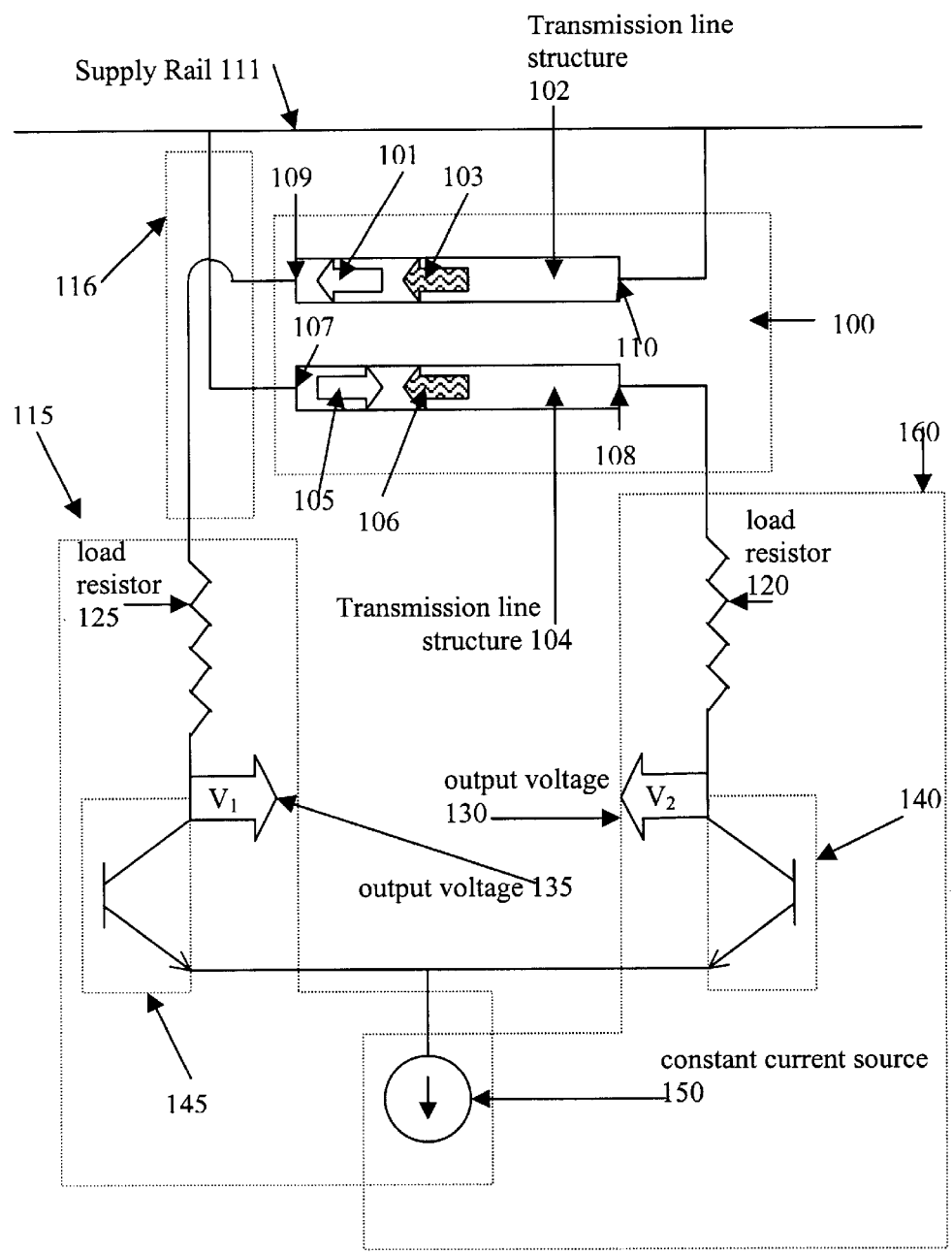
FIG. 2a illustrates a simple embodiment of the current invention, a pair of transmission line structures in a counter coupled coplanar strip line (CCPS) configuration.
Figure 2B:
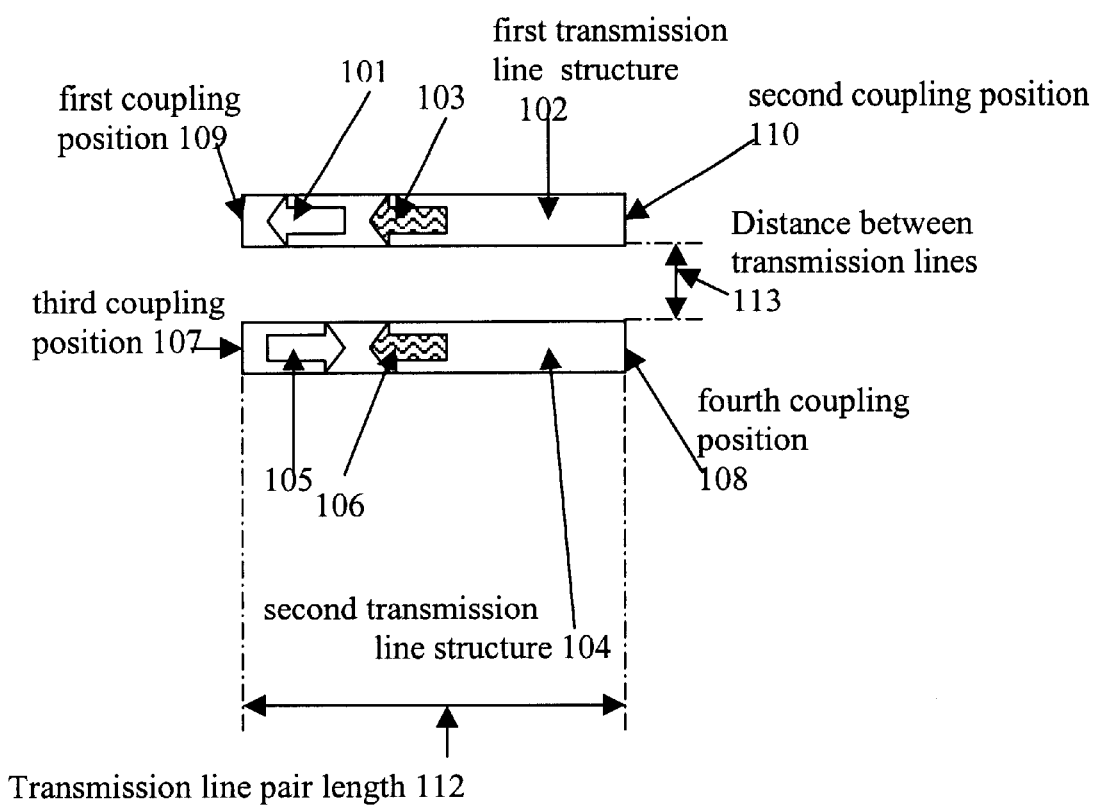
FIG. 2b illustrates a detailed view of the pair of transmission line structures.

FIG. 2a illustrates a simple embodiment of the current invention 100, a pair of transmission line structures in a counter coupled coplanar strip line (CCPS) configuration. FIG. 2b illustrates a detailed view of the pair of transmission line structures 100. In this example, a first transmission line structure 102 is coupled to a first electrical signal source module 115, or input, at a first coupling position 109 located at the first end of transmission line structure 102 and coupled to an electrical signal receiver module 111, or output, at a second coupling position 110 located at the second end of transmission line structure 102. In this example, a second transmission line structure 104 is coupled to an electrical signal receiver module 111 at a third coupling position 107 located at the first end of transmission line structure 104 and coupled to a second electrical signal source module 160, or input, at a fourth coupling position 108 located at the second end of transmission line structure 104. This arrangement of transmission lines structures 102 and 104 in an operating differential circuit may lead to AC currents 103 and 106 and DC currents 101 and 105. Coupling positions 107, 108, 109 and 110 represent locations where the current invention 100 may be coupled to one or more components external to the current invention.

Preferably, the length 112 of the transmission line structures may be kept shorter than one quarter of the operational signal wavelength (lambda or $\lambda$). However, according to an alternate embodiment of the current invention, longer structure lengths may be used. Furthermore, for alternate embodiments of the current invention implemented with transmission lines structures longer than one quarter of the operational signal wavelength, the line behavior may vary over different frequency bands, the layout area may be larger, and/or line losses may become important, which may complicate modeling activities. For example, for a 50 GHz frequency circuit, lambda is approximately 4 millimeters (mm). According to this guideline, preferably, the CCPS style transmission line structures may be kept under 1 mm in length for circuits operating around 50 GHz and for properties that are straightforward to estimate and model. In some cases, CCPS style transmission line structures may exceed one quarter of the length of the signal operational length. However, modeling long CCPS style transmission line structures may be more complex than modeling shorter CCPS style transmission line structures. For example, in some cases, accurate modeling of longer CCPS style transmission line structures may require the consideration of one or more second order effects related to line losses.

Preferably, one or more ground or reference voltage structures may be established in close proximity to the transmission line structures. Typically establishment of a nearby ground or reference structure may ease modeling efforts by helping to reproducibly fix the environment and the related line properties.

In this example, the net effect of the coupling of lines 102 and 104 is to raise the inductance seen by the differential component of a signal applied to terminals 108 and 109 and decrease the inductance seen by the common mode component of a signal applied to terminals 108 and 109. The inductance seen by the common mode component of a signal applied to terminals 108 and 109 may be called the common-mode inductance; the inductance seen by the differential component of a signal applied to terminals 108 and 109 may be called the differential inductance. In this example, the differential component of the signal may be represented as:

$$V1-V2$$

where V1 is output voltage 135 and V2 is output voltage 130.

In this example, the common mode component of the signal may be represented as:

$$(V1+V2)/2$$

where V1 is output voltage 135 and V2 is output voltage 130.

In CCPS example 100, both transmission line structures 102 and 104 are coupled to the same electrical signal receiver module, or output, 111. However, according to alternate embodiments of the current invention, the first transmission line structure may be coupled to a different electrical signal receiver module than the second transmission line structure. Alternately, the first and second transmission line structures may be coupled to the same electrical signal receiver module with differing intermediate elements. Furthermore, in CCPS example 100, the first electrical signal receiver module comprises a supply rail 111. However, the current invention may be coupled to a variety of different electrical signal receiver module implementations. Furthermore, according to the current invention, the first and second electrical signal receiver modules may share none, one or more elements.

Figure 1:
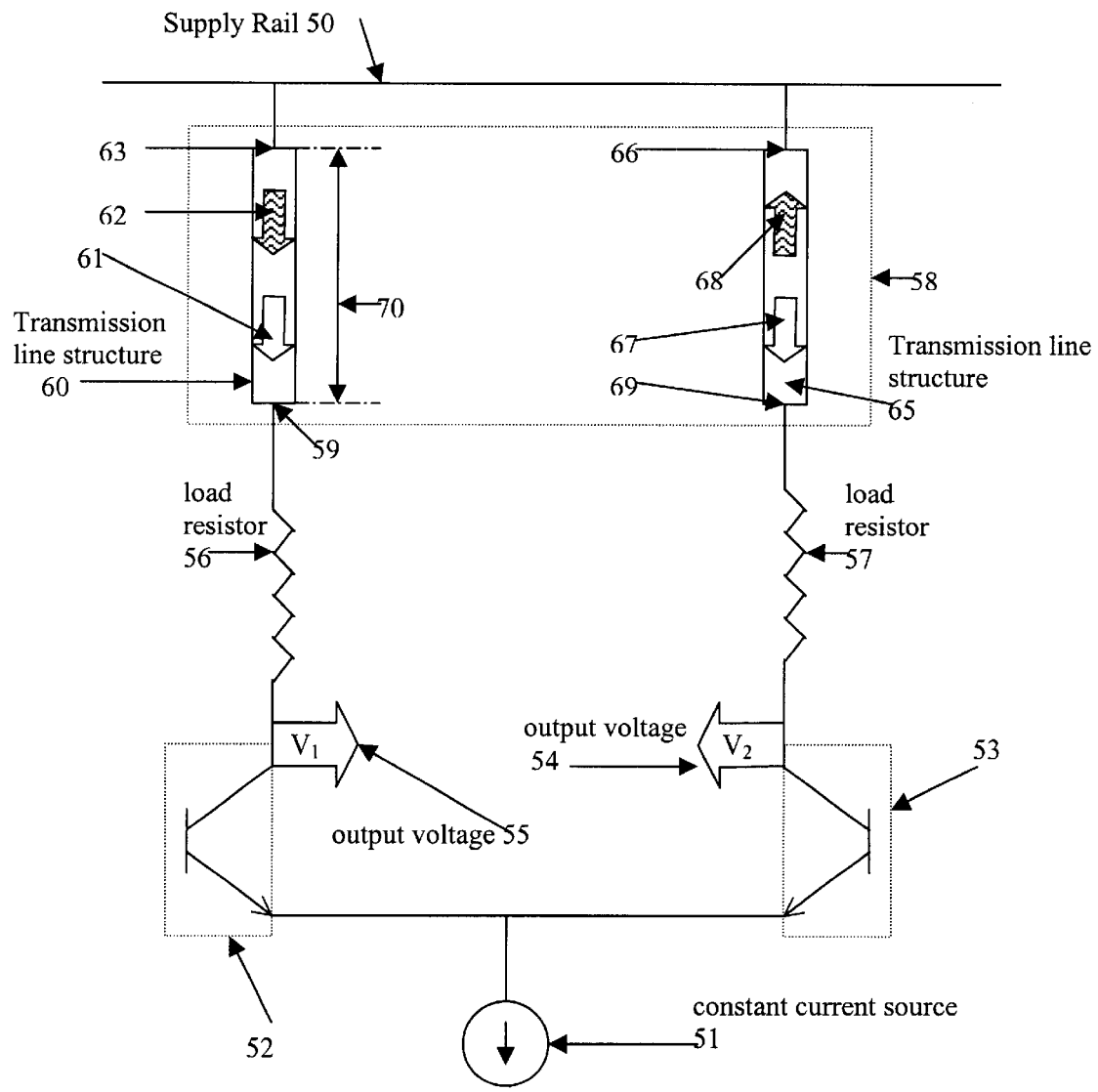
FIG. 1 illustrates an example of a differential amplifier circuit using a transmission line pair (TLP) in an example of a coplanar strip line (CPS) configuration.

In CCPS example 100, the first electrical signal source module 115 comprises a load resistor 125, a transistor 145 and a constant current source 150. Similarly, the second electrical signal source module 160 comprises a load resistor 120, a transistor 140 and a constant current source 150. In this example, electrical signal source modules 115 and 160 share an element, the constant current source 150. However, the current invention may be coupled to a variety of different electrical signal source module implementations. For example, according to the current invention, the first and second electrical signal source modules may share none, one or more elements. Furthermore, the first electrical signal source module 115 and the second electrical signal source module 160 are symmetric in FIG. 1. However, according to the current invention, the first and second electrical signal sources may or may not be symmetric. Alternately, the first and second transmission line structures may be coupled to symmetric electrical signal sources with differing intermediate elements.

In CCPS example 100, the first electrical signal source module 115 is coupled to the first transmission line structure 102 at the first coupling position 109 at the first end of transmission line structure 102. However, according to alternate embodiments of the current invention, the first coupling position 109 may be placed near, but not exactly at, the first end of the first transmission line structure 102. Similarly, the second coupling position 110 may be placed near, but not exactly at, the second end of the first transmission line structure 102; the third coupling position 107 may be placed near, but not exactly at the first end of the second transmission line structure 104; the fourth coupling position 108 may be placed near, but not exactly at the second end of the second transmission line structure 104.

Figure 3:
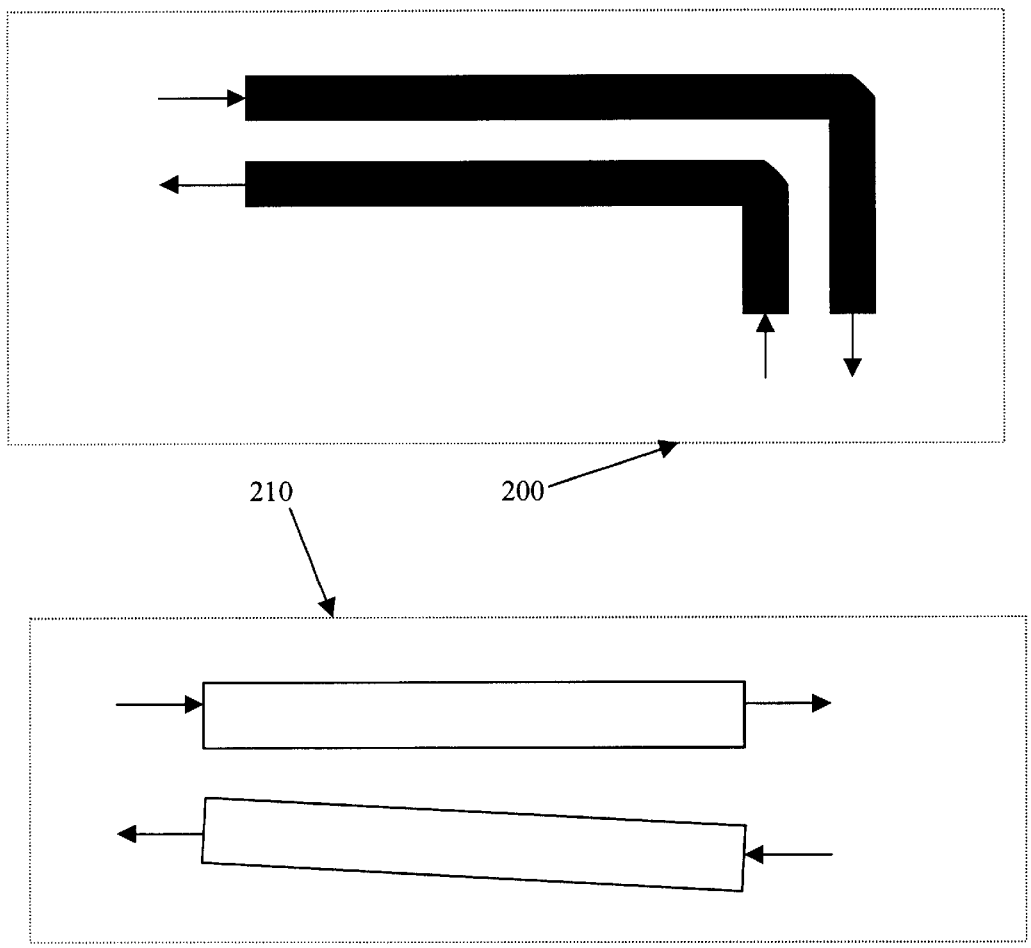
FIG. 3 illustrates two examples of alternate transmission line structures according to the current invention.

According to a simple embodiment of the current invention, transmission line structures 102 and 104 are substantially parallel and have similar shape and size. In this example, a crossover structure 116 is external to the current invention. However, according to alternate embodiments of the current invention, the first transmission line structure and/or the second transmission line structure may comprise one or more transmission line segments. According to the current invention, one or more of the first transmission line segments is substantially parallel to one or more of the second transmission line segments. However, one or more of the first transmission line segments and one or more of the second transmission line segments may be implemented at an angle with respect to each other. Furthermore, there is no requirement that the transmission line segments from the first and/or second transmission line structures have the same length, width, profile and/or thickness. In this simple example, FIG. 2 shows transmission line structures 102 and 104 as straight, parallel bars. However, according to alternate embodiments of the current invention, transmission line structure 102 and/or transmission line structure 104 may not be straight or exactly parallel. For example, in some applications one or both transmission line structures may have one or more bends or curves. FIG. 3 illustrates two examples of alternate transmission line structures 200 and 210 according to the current invention.

Figure 4:
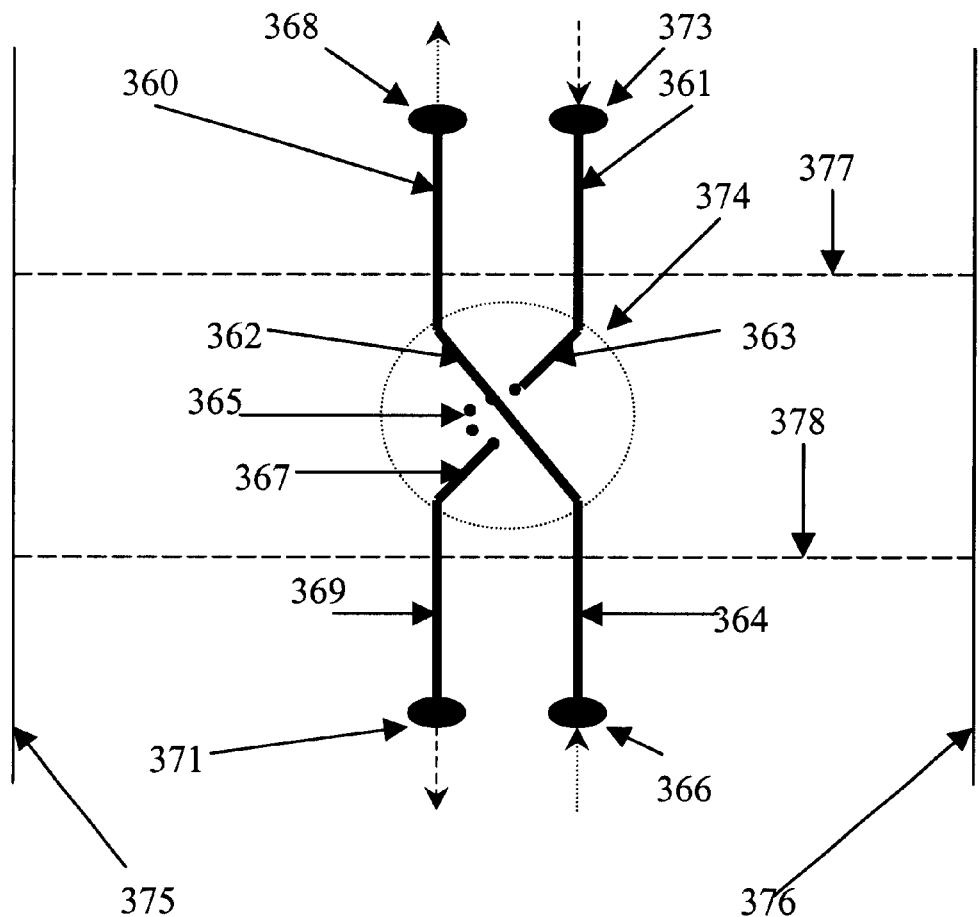
FIG. 4 illustrates an example of a preferred embodiment of the current invention implemented with a crossover structure internal to the current invention.

Furthermore, FIG. 4 illustrates an example of a preferred embodiment of the current invention implemented with a crossover structure 374 internal to the current invention. According to the current invention, the first and second transmission line structures may cross over each other. In this example, transmission line segments 360, 361, 362, 363, 367, 364 and 369 are substantially co-planar. Crossover structure 374 is implemented with transmission line segment 365 out-of-plane with respect to the rest of the CCPS. By implementing perturbations of the basic CCPS structure over a short distance, departures from basic transmission line theory may be minimized thereby simplifying modeling activities.

Typically, one or more reference voltage elements such as a ground element may be implemented external to the current invention. For example, one or more ground elements may be incorporated into the first electrical source module, the second electrical source module, the first electrical receiver module and/or the second electrical receiver module. Preferably the first and second electrical source modules may share one or more ground elements and the first and second electrical receiver modules may share one or more ground reference elements. Alternately, one or more ground structures may be shared among two or more of the following elements: first transmission line structure, second transmission line structure, first electrical signal source, second electrical signal source, first electrical signal receiver, second electrical signal receiver and elements external to the current invention. Furthermore, inclusion of one or more voltage reference elements may be implemented to improve the electrical characteristics of the current invention. Preferably, voltage reference elements may be implemented near the transmission line structures to improve and/or stabilize the electrical properties of the transmission line structures. Preferably, one or more voltage reference elements such as ground planes may be implemented above and/or below and/or in the same plane as one or more of the transmission line segments.

Figure 5A:
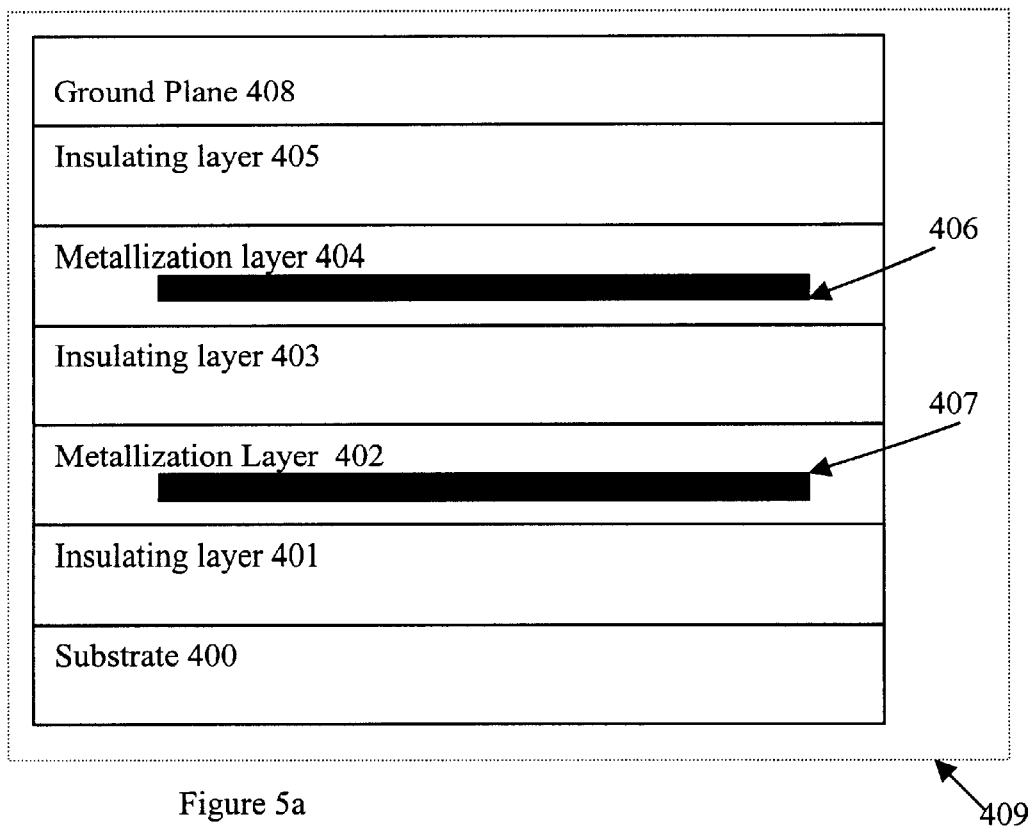
FIG. 5a illustrates an example of a simple vertical CCPS structure according to the current invention.
Figure 5B:
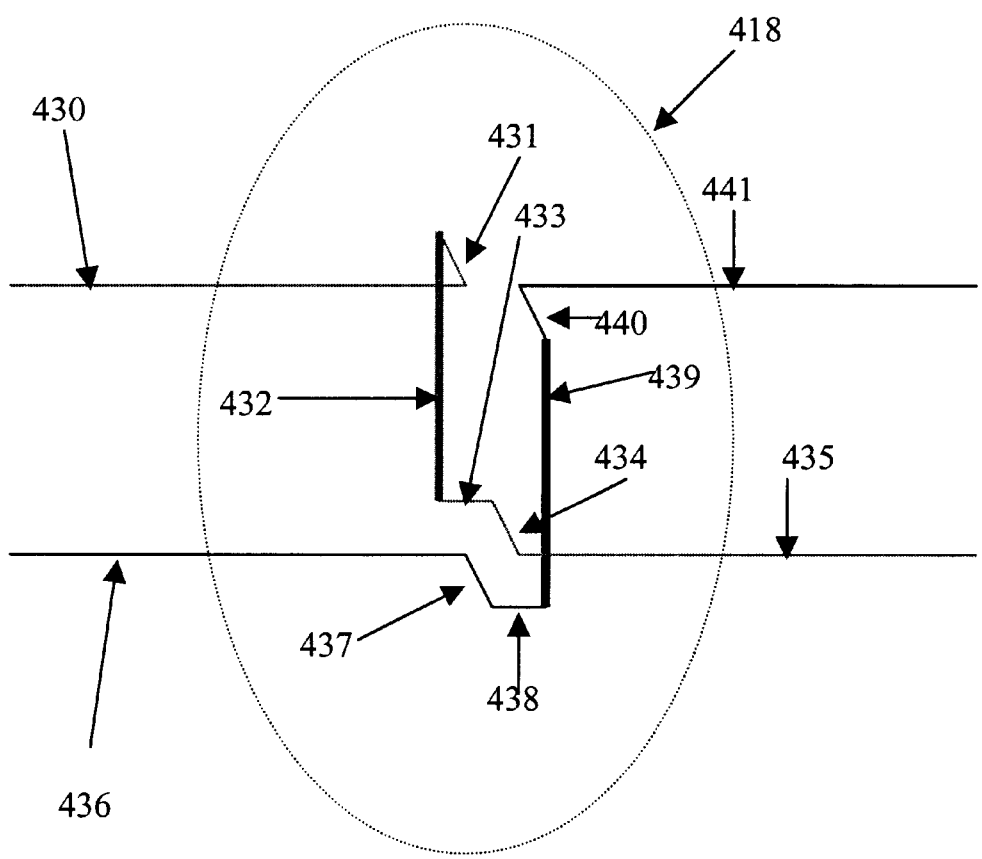
FIG. 5b illustrates an example of a simple vertical CCPS structure according to the current invention.

Furthermore, according to the current invention, the transmission line structures may be implemented in a partially vertical or completely vertical structure. For example, one or more elements of the first transmission line structure, the second transmission line structure and/or the optional crossover structure may be implemented in a vertical structure. FIG. 5*a* illustrates an example of a simple vertical CCPS structure according to the current invention. For example, a first transmission line structure 407 may be implemented in one metallization layer 402 and a second transmission line structure 406 may be implemented in a second metallization layer 404. In this manner, highly compact integrated circuit layouts may be achieved. Furthermore, according to an alternate embodiment of the current invention, an optional crossover structure may be implemented with transmission line segments inside the current invention to allow each of the lines to effectively travel part of their length on an upper metallization layer and part of their length on a lower metallization layer. FIG. 5*b* illustrates an example of a vertical CCPS structure according to the current invention with an optional vertical crossover structure 418. In this example, the first transmission line structure comprises segments 430, 431, 432, 433, 434 and 435; the second transmission line structure comprises segments 436, 437, 438, 439, 440 and 441. According to this example, preferably, segments 433, 434, 435, 436, 437, and 438 are substantially co-planar and exist in a first metallization layer; segments 430, 431, 440 and 441 are substantially co-planar and exist in a second metallization layer; segments 432 and 439 are substantially co-planar and connect segments in the first metallization layer to segments in the second metallization layer through one or more insulating layers. Optionally, one or more additional intermediate layers may exist between the two metallization layers.

According to a preferred embodiment of the current invention, the first and second transmission line structures may be implemented in horizontal, vertical or mixed horizontal/vertical configurations. According to various embodiments of the current invention, one or more first transmission line segments and one or more second transmission line segments may be separated wholly or in part by one or more layers such as, but not limited to, one or more insulating layers and/or a central ground plane. Furthermore, according to an alternate embodiment of the current invention, one or more first transmission line segments and/or one or more second transmission line segments may be implemented as one or more bond wires disposed above a chip and attached to pads on a chip. Preferably, in this case, the bond wire segments may be separated by air. However, according to alternate embodiments of the current invention, a vacuum, a partial vacuum, gas, solid material, and/or liquid may separate one or more of the first transmission line segments and one or more of the second transmission line segments.

Figure 6:
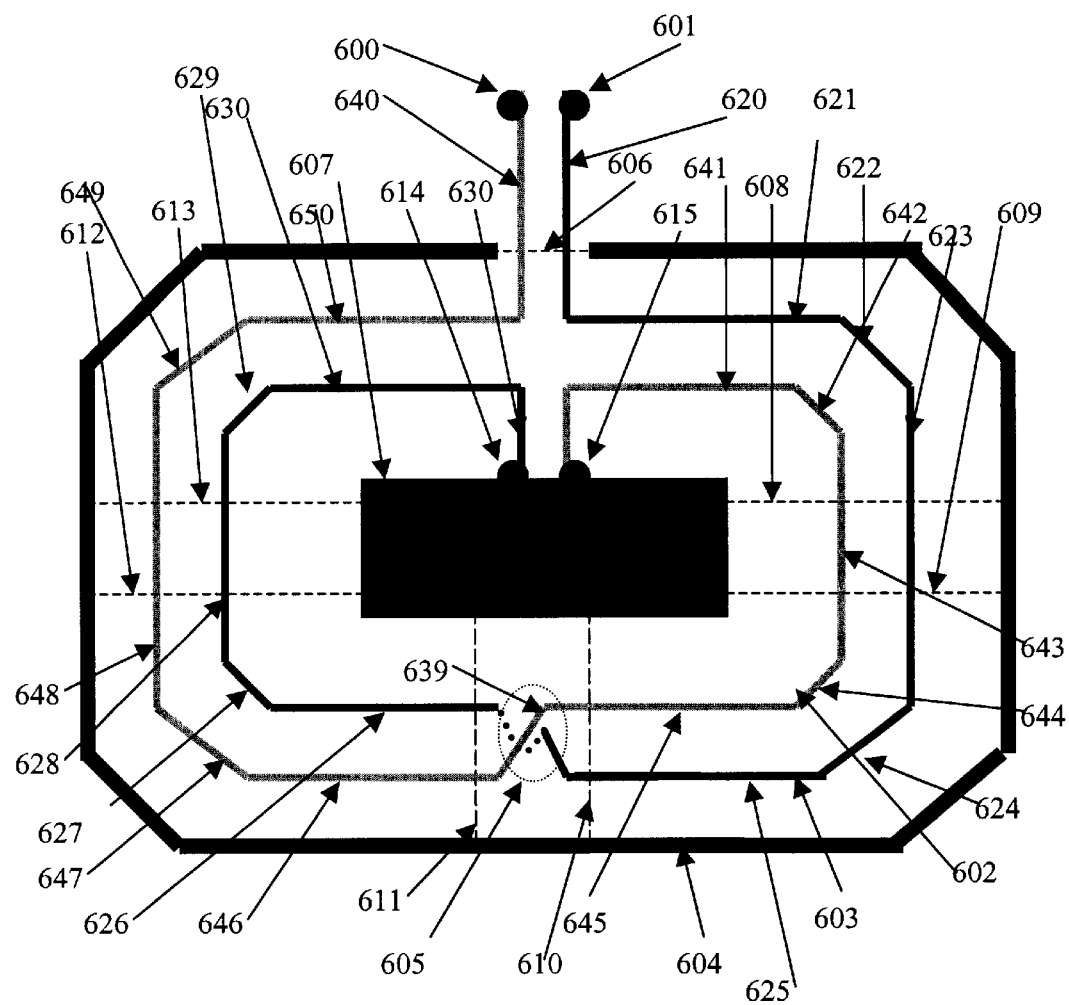
FIG. 6 illustrates an example of an alternate embodiment of the current invention implemented in a circular style layout with a crossover structure internal to the current invention.

FIG. 6 illustrates an example of an alternate embodiment of the current invention implemented in a circular style layout with a crossover structure 605 internal to the current invention. In this example, first transmission line structure 602 comprises transmission line segments 639, 640, 641, 642, 643, 644, 645, 646, 647, 648, 649, and 650 as well as coupling position 600 for coupling to a first electrical signal source module and coupling position 615 for coupling to a first electrical signal receiver module; second transmission line structure 603 comprises transmission line segments 620, 621, 622, 623, 624, 625, 626, 627, 628, 629, and 630 as well as coupling position 601 for coupling to a second electrical signal source module and coupling position 614 for coupling to a second electrical signal receiver module and transmission line segments internal to crossover structure 605 for interconnecting segment 625 with segment 626. According to this example, the following pairs of transmission line segments are substantially parallel and of similar, but not necessarily identical dimensions: 620 and 640, 621 and 641, 622 and 642, 623 and 643, 624 and 644, 625 and 645, 626 and 646, 627 and 647, 628 and 648, 629 and 649, 630 and 650. In this example, crossover structure 605 is used to help improve symmetry. Typically, reflections and/or conversion of energy between odd and even modes may be further suppressed by the addition of ground lines with straps external to the current invention. In this example, a ground ring structure comprising segment 604 and segment 606 is implemented. In this example, ground ring segment 606 is implemented partially out-of-plane to avoid shorting out transmission lines 602 and 603; ground straps 608, 609, 610, 611, 612 and 613 link ground pad 607 with the ground ring structure and are also implemented partially out of plane to prevent contacting or shorting out transmission lines 602 and 603. In this example, external elements comprising grounds 604 and 607, ground segment 606 ground straps 608, 609, 610, 611, is 612 and 613 may be used to improve the properties of the current invention. In this example, the first and second receiver modules comprise the same element, ground pad 607. In this example, a circular style layout is implemented using transmission line segments comprising straight lines. However, according to alternate embodiments of the current invention, a variety of layouts such as a circular style layout may be implemented using transmission line segments comprising different and/or more complex geometries. For example, transmission line segments shaped like arcs may be used and the geometries of the resulting transmission line structures may appear more rounded or oval.

Figure 7:
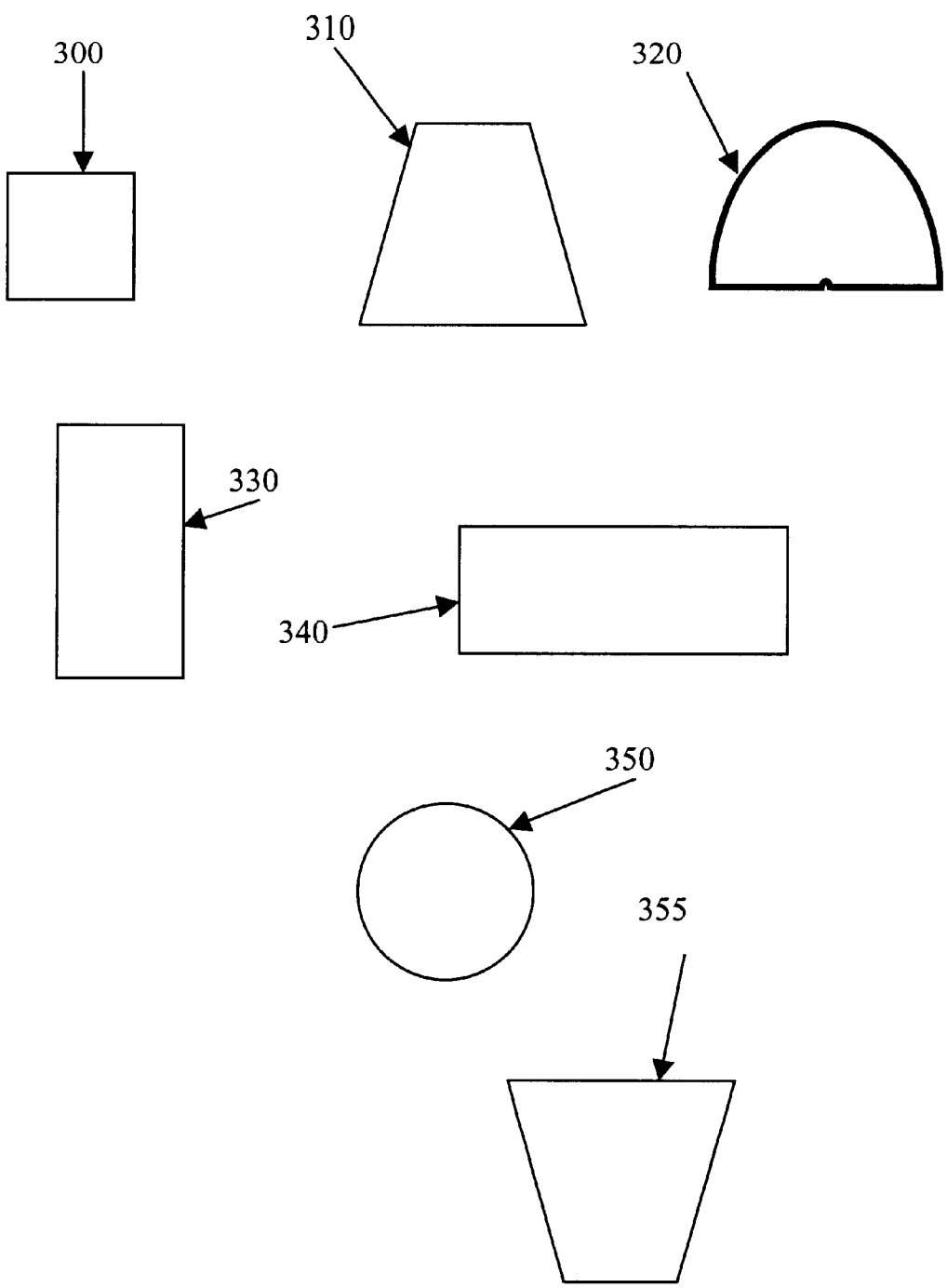
FIG. 7 illustrates six examples of cross sectional profiles for transmission line segments.

Furthermore, FIG. 7 illustrates six examples of cross sectional profiles for transmission line segments. Typically, the first and second transmission lines may comprise transmission line segments with the same or similar cross sectional profiles. However, according to alternate embodiments of the current invention, the first and second transmission lines may comprise transmission line segments with different cross sectional profiles. For example, considering the pair of transmission line structures in a counter coupled coplanar strip line (CCPS) configuration 100 illustrated in FIG. 2*a*, transmission line structures 102 and 104 may be implemented in the same plane, resulting in a horizontal structure. Alternately, transmission line structure 102 may be implemented in a plane above or below transmission line 104, resulting in a vertical structure. For some implementations, a vertical CCPS structure may provide a more compact structure than CPW structures and/or horizontal CCPS structures. For example, considering the CCPS structures 409 and 420 as illustrated in FIGS. 5*a* and 5*b*, insulating layers 413 and 403 would typically be thinner than the required ground plane structure with accompanying insulating planes required by a typical CPW style structure in that position. Furthermore, because the differential inductance per unit length of a typical CPW structure tends to be lower than a similar CCPS structure, longer transmission lines may be required for a CPW style layout compared to a CCPS style layout in order to achieve a similar differential inductance value.

In some cases, different metal layers in integrated circuits may be implemented with different thicknesses. For example, metallization layer 412 may not be the same thickness as metallization layer 414 by design or manufacture. For example, this may lead to vertical CCPS configurations according to the current invention wherein not all of the transmission line segments in the first and/or second transmission line have the same thickness and/or profile. A variety of alternate designs and/or implementations according to the current invention may comprise first and second transmission line structures with transmission line segments having different thicknesses and/or profiles. Furthermore, additional asymmetries may be implemented by design and/or manufacture according to the current invention. For example, transmission line segment profiles may vary from metallization layer to metallization layer depending on a variety of design and processing issues. Implementation of a vertical crossover structure within the current invention such as crossover structure 418 as illustrated in FIG. 5*b* may be used to minimize some asymmetries such as, but not limited to, asymmetries due to transmission line segment is thickness and/or profile variation. Furthermore, according to alternate embodiments of the current invention, the cross sectional profile of transmission line segments in one or both of the transmission line structures may or may not change over the length of the device.

Preferably, the current invention may be implemented using integrated circuit technology. According to a preferred embodiment of the current invention, a pair of transmission line structures in a CCPS configuration may be implemented on the same chip, board or component as the first and second electrical signal source modules and the first and second electrical signal receiver modules. However, according to alternate embodiments of the current invention, a pair of transmission line structures in a CCPS configuration may be implemented on a different chip, board or component from the first and/or second electrical signal source modules and/or the first and/or second electrical signal receiver modules. Furthermore, an optional crossover module may be implemented on the same or different chip, board or component from the pair of transmission line structures in a CCPS configuration. Alternately, in cases where the entire first electrical signal source module is not implemented on the same chip, board or component, pair of transmission line structures in a CCPS configuration may or may not be implemented on the same chip, board or component as some portion of the first electrical signal source module. Similarly, a pair of transmission line structures in a CCPS configuration may or may not be implemented on the same chip, board or component as some portion of the second electrical signal source module and/or some portion of the first electrical signal receiver module and/or some portion of the second electrical signal receiver module. According to alternate embodiments of the current invention, a pair of transmission line structures in a CCPS configuration may be implemented using a variety of technologies. For example, a pair of transmission line structures in a CCPS configuration may be implemented on a printed circuit board.

The current invention may be used in a variety of applications. For example, a pair of transmission line structures in a CCPS configuration may be used in a variety of broadband circuits such as frequency dividers and other digital circuitry. Also, a pair of transmission line structures in a CCPS configuration may be used in a variety of narrow band circuits such as, but not limited to, amplifiers, oscillators and mixers. Furthermore, a wide range of applications such as personal communications devices, wireless local area networks, satellite communications devices and global positioning system components may benefit from the use of a pair of transmission line structures s in CCPS configurations.

A rough analysis may be used to illustrate the increased effective differential inductance with a pair of transmission line structures in the CCPS configuration 100 according to the current invention compared to a similar TLP in the CPS configuration 58. The following analysis is not meant to be a definitive, theoretical or detailed derivation of electrical properties; the following analysis is meant to illustrate that for a particular configuration, a rough estimate of the effective differential inductance implies that an increased effective differential inductance may be achieved by using a pair of transmission line structures in the CCPS configuration 100 according to the current invention instead of a similar, particular TLP in the CPS configuration 58. Assuming that the length 112 of the pair of transmission line structures 100 and the length 70 of TLP 58 are both shorter than one quarter of the operational signal wavelength, a rough estimate of the effective differential inductance for the TLP in the CPS configuration 58, $L_{dfCPS}$, may be represented as:

$$L_{dfCPS} = t_{oCPS}(Z_{oCPS} - Z_{TCPS}^2/Z_{oCPS})$$

where $L_{dfCPS}$ is the effective inductance seen by the differential signal on nodes 59 and 69 for the TLP in the CPS configuration 58;

$t_{oCPS}$ is the time required for an odd mode signal to travel from position 59 to position 63 or the transmission pair length 70;

$Z_{oCPS}$ is the odd mode characteristic impedance for the TLP 58 in the CPS configuration 58;

$Z_{TCPS}$ is the terminating impedance at the non-driven ends 63 and 66.

A rough estimate of the differential effective inductance for the pair of transmission line structures in the CCPS configuration 100, $L_{dfCCPS}$, may be represented as:

$$L_{dfCCPS} = t_{eCCPS}Z_{eCCPS} - t_{oCCPS}Z_{TCCPS}^2/Z_{oCCPS}$$

where $L_{dfCCPS}$ is the effective inductance seen by the differential signal on nodes 109 and 108 for the pair of transmission line structures in the CCPS configuration 100;

$t_{eCCPS}$ is the time required for an even mode signal to travel from position 109 to position 110 or the transmission line structure length 112;

$t_{oCCPS}$ is the time required for an odd mode signal to travel from position 109 to position 110 or the transmission line structure length 112;

$Z_{eCCPS}$ is the even mode characteristic impedance for the pair of transmission line structures in the CCPS configuration 100;

$Z_{oCCPS}$ is the odd mode characteristic impedance for the pair of transmission line structures in the CCPS configuration 100;

$Z_{TCCPS}$ is the terminating impedance at the non-driven ends 110 and 107.

When transmission line structures 102, 104, 60 and 65 are the same length, shape and size, we assume:

$$Z_{oCCPS} = Z_{oCPS} = Z_o;$$

$$Z_{TCCPS} = Z_{TCPS} = Z_T;$$

$$t_{oCCPS} = t_{oCPS} = t_o;$$

Typically, when the distance between transmission line segments, such as distance 113, the distance between transmission line structure 102 and transmission line structure 104, is not infinite, $Z_e$ is greater than or equal to $Z_o$. In some cases, $Z_e$ may be approximately twice the size of $Z_o$ according to a preferred embodiment of the current invention. Furthermore, for circuits fabricated using some integrated circuit processes, $t_e > t_o$. When the TLP is connected directly to the supply, $Z_T$ is effectively zero. For example, for pair of transmission line structures in a CCPS configuration 100, there are no intervening electrical elements between position 110 and supply rail 111; there are no intervening electrical elements between position 107 and supply rail 111. For TLP 58, there are no intervening electrical elements between position 63 and supply rail 50; there are no intervening electrical elements between position 66 and supply rail 50. In this example and with these assumptions and estimates, $L_{dfCCPS}$ is greater than $L_{dfCPS}$. Note that for similar cases, where $Z_T$ is non-zero, the ratio of $L_{dfCCPS}$ and $L_{dfCPS}$ is greater than for the case where $Z_T$ is zero. For example, $Z_T$ may be non-zero when intervening electrical elements such as, but not limited to, resistors exist between the pair of transmission line structures in a CCPS configuration 100 and the supply.

Furthermore, a similar rough analysis may be used to illustrate the decreased effective common-mode inductance with pair of transmission line structures in the CCPS configuration 100 according to the current invention compared to a similar TLP in the CPS configuration 58. The following analysis is not meant to be a definitive, theoretical or detailed derivation of electrical properties; the following analysis is meant to illustrate that for a particular configuration, a rough estimate of the effective common-mode inductance implies that a decreased effective common-mode inductance may be achieved by using a pair of transmission line structures in the CCPS configuration 100 according to the current invention instead of a similar, particular TLP in the CPS configuration 58. Assuming that the length 112 of the pair of transmission line structures in the CCPS configuration 100 and the length 70 of TLP 58 are both shorter than one quarter of the operational signal wavelength, a rough estimate of the effective common-mode inductance for the TLP in the CPS configuration 58, $L_{cmCPS}$, may be represented as:

$$L_{cmCPS} = t_{eCPS}(Z_{eCPS} - Z_{TCPS}^2/Z_{eCPS})$$

where $L_{cmCPS}$ is the effective inductance seen by the common-mode signal on nodes 59 and 69 for the TLP in the CPS configuration 58;

$t_{eCPS}$ is the time required for an even mode signal to travel from position 59 to position 63 or the transmission line structure length 70;

$Z_{eCPS}$ is the even mode characteristic impedance for the TLP 58 in the CPS configuration 58;

$Z_{TCPS}$ is the terminating impedance at the non-driven ends 63 and 66.

A rough estimate of the common mode effective inductance for the pair of transmission line structures in the CCPS configuration 100, $L_{cmCCPS}$, may be represented as:

$$L_{cmCCPSS} = t_{oCCPS}Z_{oCCPS} - t_{eCCPS}Z_{TCCPS}^2/Z_{eCCPS}$$

where $L_{cmCCPS}$ is the effective inductance seen by the common mode signal on nodes 109 and 108 for the pair of transmission line structures in the CCPS configuration 100;

$t_{eCCPS}$ is the time required for an even mode signal to travel from position 109 to position 110 or the transmission line structure length 112;

$t_{oCCPS}$ is the time required for an odd mode signal to travel from position 109 to position 110 or the transmission line structure length 112;

$Z_{eCCPS}$ is the even mode characteristic impedance for the pair of transmission line structures in the CCPS configuration 100;

$Z_{oCCPS}$ is the odd mode characteristic impedance for the pair of transmission line structures in the CCPS configuration 100;

$Z_{TCCPS}$ is the terminating impedance at the non-driven ends 110 and 107.

When transmission line structures 102, 104, 60 and 65 are the same length, shape and size, we assume:

$$Z_{oCCPS} = Z_{oCPS} = Z_o;$$

$$Z_{TCCPS} = Z_{TCPS} = Z_T;$$

$$t_{eCCPS} = t_{eCPS} = t_e;$$

For the example and the assumptions and estimates discussed below the differential signal discussion, $L_{cmCCPS}$ is smaller than $L_{cmCPS}$. Note that for similar cases, where $Z_T$ is non-zero, the ratio of $L_{cmCCPS}$ and $L_{cmCPS}$ is smaller than for the case where $Z_T$ is zero. For example, $Z_T$ may be non-zero when intervening electrical elements such as, but not limited to, resistors exist between the transmission line structures and the supply.

FIGS. 8a and 8b illustrate a preferred process according to the current invention for increasing the effective differential inductance of transmission line structures. The process begins when a first transmission line structure comprising one or more contiguous first transmission line segments is established (Step 500). The process continues when a first coupling position for coupling to a first electrical signal source module, or input, is established at or near the first end of the first transmission line structure (Step 510). For example, for various integrated circuit processing compatible processes according to the current invention, a coupling position may be used to couple to an on-chip or off-chip element. The position and details of the steps related to establishing coupling positions may vary according to the technologies used. For example, one or more of the first and/or second transmission line segments may be fashioned from bond wires above an integrated circuit chip. In this case, the coupling positions may be established before some or all of the first and/or second transmission line structures are established. Furthermore, the steps related to establishing one or more of the coupling positions may be executed by establishing one or more contact pads and/or bondpads on the integrated circuit chip. However, it is important to note that a variety of existing technologies may be used in the process of increasing the effective differential inductance of transmission line structures according to the current invention such as, but not limited to, printed circuit board technology and integrated circuit technology. The process continues when a second coupling position for coupling to a first electrical signal receiver module, or output, is established at or near the second end of the first transmission line structure (Step 520). The process continues when a second transmission line structure comprising one or more contiguous first transmission line segments is established adjacent to the first transmission line structure (Step 525). One or more of the first transmission line segments is substantially parallel to one or more of the second transmission line segments. Furthermore, the first end of the first transmission line structure is adjacent to the first end of the second transmission line structure and the second end of the first transmission line structure is adjacent to the second end of the second transmission line structure. The two transmission line structures may be substantially parallel and straight. However, one or more of the transmission line segments may not be straight. For example, according to the current invention, one or more first or second transmission line segments may comprise one or more curved and/or bent lines. The transmission line structures are established such that one or more of the first transmission line segments is substantially parallel to one or more of the second transmission line segments. Preferably, a portion of the first transmission line structure crosses over or under a portion of the second transmission line structure. In some cases, the crossover may be established through configuration of transmission line segments. Alternately, the crossover may be established with an optional crossover structure. Preferably, such perturbations from a substantially parallel transmission line structure may be implemented over a short distance. By maintaining variation from the simple, parallel transmission line structures within a short distance or small region and/or maximizing overall symmetry, difficulties in modeling the characteristics of the transmission line structures according to basic transmission line theory may be minimized. After the process according to the current invention, the step of establishing a first transmission line structure and the step of establishing a second transmission line structure may result in a horizontal, partially vertical or wholly vertical configuration. Preferably, the transmission line structure lengths may be kept shorter than one quarter of the operational signal wavelength (lambda or λ). However, according to alternate processes according to the current invention, longer lines may be established. With implementation of transmission line structures longer than one quarter of the operational signal wavelength, the line behavior may vary over different frequency bands, the layout area may be larger, and/or line losses may become important, which may complicate modeling activities. The process continues when a third coupling position for coupling to a second electrical signal receiver module, or output, is established at or near the first end of the second transmission line structure, adjacent to the first end of the first transmission line structure (Step 530). The process continues when a fourth coupling position for coupling to a second electrical signal source module, or input, is established at or near the second end of the second transmission line structure, adjacent to the second end of the first transmission line structure (Step 540). Optionally, a crossover module may be coupled to the current invention (Step 550). According to some processes after the current invention, a crossover module may be coupled to the pair of transmission line structures in the CCPS configuration to ease routing issues. This may be especially important when the optional crossover structure is not integrated into the pair of transmission line structures in the CCPS configuration. Optionally, a first electrical signal source module may be coupled to the first transmission line structure at the first coupling position (Step 560). Optionally, a first electrical signal receiver module may be coupled to the first transmission line structure at the second coupling position (Step 570). Optionally, a second electrical signal receiver module may be coupled to the second transmission line structure at the third coupling position (Step 580). According to some processes according to the current invention, the first electrical signal receiver module may sometimes be used as the second electrical signal receiver module. Optionally, a second electrical signal source may be coupled to the second transmission line structure at the fourth coupling position (Step 590).

It is important to note that an alternate process according to the current invention for increasing the effective differential inductance of vertical pairs of transmission line structures in the CCPS configuration may require re-ordering of process steps 500, 510, 520, 530, 540, 550, 560, 570, 580, and 590.

The foregoing described embodiments of the invention are provided as illustrations and descriptions. They are not intended to limit the invention to precise form described. In particular, the Applicants contemplate that functional implementation of the invention described herein may be implemented using a variety of techniques in a wide range of materials systems. Also, the process steps describing the methods may be re-arranged and/or re-ordered. Other variations and embodiments are possible in light of above teachings, and it is thus intended that the scope of invention not be limited by this Detailed Description, but rather by Claims following.

I claim:

1. An electronic apparatus with enhanced inductance characteristics comprising:
   a first transmission line structure comprising:
      one or more contiguous first transmission line segments;
      a first coupling position located substantially at the first end of said first transmission line structure for coupling to a first electrical signal source module and
      a second coupling position located substantially at the second end of said first transmission line structure for coupling to a first electrical signal receiver module and,
   a second transmission line structure adjacent to said first transmission line comprising:
      one or more contiguous second transmission line segments wherein one or more of said second transmission line segments are substantially parallel to one or more of said first transmission line segments;
      a third coupling position located substantially at the first end of said second transmission line structure and adjacent to said first end of said first transmission line structure for coupling to a second electrical signal receiver module and
      a fourth coupling position located substantially at the second end of said second transmission line structure and adjacent to said second end of said first transmission line structure for coupling to a second electrical signal source module
   whereby, when an electrical signal is applied across said first coupling position and said fourth coupling position,
      currents associated with the differential component of said electrical signal in one or more of said first transmission line segments and one or more of said second transmission line segments are substantially aligned and
      currents associated with the common mode component of said electrical signal in one or more of said first transmission line segments and one or more of said second transmission line segments are substantially counter-aligned.

2. The electronic apparatus of claim 1 wherein said first transmission line structure and said second transmission line structure are substantially co-planar.

3. The electronic apparatus of claim 1 wherein one or more of said first transmission line segments are disposed on different plane than one or more of said second transmission line segments.

4. The electronic apparatus of claim 1 wherein one or more of said first transmission line segments are horizontally disposed with respect to one or more of said second transmission line segments.

5. The electronic apparatus of claim 1 wherein one or more of said first transmission line segments are vertically disposed with respect to one or more of said second transmission line segments.

6. The electronic apparatus of claim 1 wherein one or more of said first transmission line segments are substantially straight.

7. The electronic apparatus of claim 1 wherein one or more of said second transmission line segments are substantially straight.

8. The electronic apparatus of claim 1 wherein one or more of said first transmission line segments have a shape comprising one or more bends.

9. The electronic apparatus of claim 1 wherein one or more of said second transmission line segments have a shape comprising one or more bends.

10. The electronic apparatus of claim 1 further comprising a crossover structure.

11. The electronic apparatus of claim 1 wherein the length of said first transmission line structure is less than one quarter of the operational signal wavelength.

12. The electronic apparatus of claim 1 wherein the length of said second transmission line structure is less than one quarter of the operational signal wavelength.

13. The electronic apparatus of claim 1 wherein said first electrical signal receiver module and said second electrical signal receiver module comprise the same electrical signal receiver module.

14. The electronic apparatus of claim 1 wherein said first electrical signal source module and said second electrical signal source module share one or more components.

15. The electronic apparatus of claim 1 wherein said first electrical signal receiver module and said second electrical signal receiver module share one or more components.

16. The electronic apparatus of claim 1 wherein one or more intervening electrical elements exist between said first coupling position and said first electrical signal source module.

17. The electronic apparatus of claim 1 wherein one or more intervening electrical elements exist between said second coupling position and said first electrical signal receiver module.

18. The electronic apparatus of claim 1 wherein one or more intervening electrical elements exist between said third coupling position and said second electrical signal receiver module.

19. The electronic apparatus of claim 1 wherein one or more intervening electrical elements exist between said fourth coupling position and said second electrical signal source module.

20. The electronic apparatus of claim 1 wherein said first transmission line structure and said second transmission line structure are disposed on the same integrated circuit as at least some portion of one or more external elements selected from the group consisting of said first electrical signal receiver module, said second electrical signal receiver module, said first electrical signal source module and said second electrical signal source module.

21. The electronic apparatus of claim 1 wherein one or more of said first transmission line segments and one or more of said second transmission line segments are separated by one or more layers.

22. The electronic apparatus of claim 1 further comprising one or more reference voltage elements.

23. The electronic apparatus of claim 22 wherein one or more of said voltage elements are substantially in the same plane as one or more elements selected from the group consisting of one or more first transmission line segments and one or more second transmission line segments.

24. The electronic apparatus of claim 22 wherein one or more of said voltage elements are in a different plane from one or more elements selected from the group consisting of one or more first transmission line segments and one or more second transmission line segments.

25. The electronic apparatus of claim 21 wherein said one or more of said layers comprise an insulating layer selected from the group consisting of a solid material, a liquid material, a vacuum, gas, air, and a partial vacuum.

26. The electronic apparatus of claim 1 wherein said first transmission line structure and said second transmission line structure are elements of a module selected from the group consisting of an integrated circuit, a printed circuit board and a bond wire structure.

27. A process for enhancing the inductance characteristics of transmission line pairs comprising:
    establishing a first transmission line structure comprising:
        one or more contiguous first transmission line segments;
        a first coupling position located substantially at the first end of said first transmission line structure for coupling to a first electrical signal source module and
        a second coupling position located substantially at the second end of said first transmission line for coupling to a first electrical signal receiver module and
    establishing a second transmission line structure comprising:
        one or more contiguous second transmission line segments wherein one or more of said first transmission line segments is substantially parallel to one or more of said second transmission line segments;
        a third coupling position located substantially at the first end of said second transmission line for coupling to a second electrical signal receiver module and
        a fourth coupling position located substantially at the second end of said second transmission line for coupling to a second electrical signal source module,
    wherein the first end of said first transmission line structure is adjacent to the first end of said second transmission line structure and the second end of said first transmission line structure is adjacent to the second end of said second transmission line structure and
    whereby, when an electrical signal is applied across said first coupling position and said fourth coupling position,
        currents associated with the differential component of said electrical signal in one or more of said first transmission line segments and one or more of said second transmission line segments are substantially aligned and
        currents associated with the common mode component of said electrical signal in one or more of said first transmission line segments and one or more of said second transmission line segments are substantially counter-aligned.

28. The process of claim 27 further comprising the step of establishing an optional crossover structure coupled to said first transmission line structure and said second transmission line structure.

29. The process of claim 27 further comprising the step of establishing one or more reference voltage elements.

30. The process of claim 29 wherein one or more of said reference voltage elements are established in the same plane as one or more elements selected from the group consisting of one or more first transmission line segments and one or more second transmission line segments.

31. The process of claim 29 wherein one or more of said reference voltage elements are established in a different plane from one or more elements selected from the group consisting of one or more first transmission line segments and one or more second transmission line segments.

32. A system with enhanced inductance characteristics for differential transmission lines comprising one or more electronic elements coupled to a transmission line pair in a counter coupled coplanar strip line configuration wherein said transmission line pair comprises:
    a first transmission line structure comprising:
        one or more contiguous first transmission line segments;
        a first coupling position located substantially at the first end of said first transmission line structure for coupling to a first electrical signal source module and
        a second coupling position located substantially at the second end of said first transmission line structure for coupling to a first electrical signal receiver module and, a second transmission line structure adjacent to said first transmission line comprising:
  one or more contiguous second transmission line segments wherein one or more of said second transmission line segments are substantially parallel to one or more of said first transmission line segments;
  a third coupling position located substantially at the first end of said second transmission line structure and adjacent to said first end of said first transmission line structure for coupling to a second electrical signal receiver module and
  a fourth coupling position located substantially at the second end of said second transmission line structure and adjacent to said second end of said first transmission line structure for coupling to a second electrical signal source module
whereby, when an electrical signal is applied across said first coupling position and said fourth coupling position,
  currents associated with the differential component of said electrical signal in one or more of said first transmission line segments and one or more of said second transmission line segments are substantially aligned and
  currents associated with the common mode component of said electrical signal in one or more of said first transmission line segments and one or more of said second transmission line segments are substantially counter-aligned.

33. The system of claim 32 wherein one or more of said electronic elements comprise an element selected from the group consisting of said first electrical signal receiver module, said second electrical signal receiver module, said first electrical signal source module, said second electrical signal source module, and a crossover structure.

34. An electronic apparatus for increasing the effective inductance of transmission line pairs comprising:
  a first electrical signal source module;
  a first electrical signal receiver module;
  a second electrical signal source module;
  a second electrical signal receiver module;
  a first transmission line structure comprising:
    one or more contiguous first transmission line segments;
    a first coupling position located substantially at the first end of said first transmission line structure for coupling to said first electrical signal source module and
    a second coupling position located substantially at the second end of said first transmission line structure for coupling to said first electrical signal receiver module and,
  a second transmission line structure adjacent to said first transmission line comprising:
    one or more contiguous second transmission line segments wherein one or more of said second transmission line segments are substantially parallel to one or more of said first transmission line segments;
    a third coupling position located substantially at the first end of said second transmission line structure and adjacent to said first end of said first transmission line structure for coupling to said second electrical signal receiver module and
    a fourth coupling position located substantially at the second end of said second transmission line structure and adjacent to said second end of said first transmission line structure for coupling to said second electrical signal source module
whereby, when an electrical signal is applied across said first coupling position and said fourth coupling position,
  currents associated with the differential component of said electrical signal in one or more of said first transmission line segments and one or more of said second transmission line segments are substantially aligned and
  currents associated with the common mode component of said electrical signal in one or more of said first transmission line segments and one or more of said second transmission line segments are substantially counter-aligned.

35. The electronic apparatus of claim 34 wherein said first transmission line structure and said second transmission line structure are substantially co-planar.

36. The electronic apparatus of claim 34 wherein one or more said first transmission line segments are disposed on different plane than one or more of said second transmission line segments.

37. The electronic apparatus of claim 34 wherein one or more of said first transmission line segments are horizontally disposed with respect one or more of said second transmission line segments.

38. The electronic apparatus of claim 34 wherein one or more of said first transmission line segments are vertically disposed with respect to one or more of said second transmission line segments.

39. The electronic apparatus of claim 34 wherein one or more of said first transmission line segments are substantially straight.

40. The electronic apparatus of claim 34 wherein one or more of said second transmission line segments are substantially straight.

41. The electronic apparatus of claim 34 wherein one or more of said first transmission line segments has a shape comprising one or more bends.

42. The electronic apparatus of claim 34 wherein one or more of said second transmission line segments has a shape comprising one or more bends.

43. The electronic apparatus of claim 34 further comprising a crossover structure.

44. The electronic apparatus of claim 34 wherein the length of said first transmission line structure is less than one quarter of the operational signal wavelength.

45. The electronic apparatus of claim 34 wherein the length of said first transmission line structure is less than one quarter of the operational signal wavelength.

46. The electronic apparatus of claim 34 wherein said first electrical signal receiver module and said second electrical signal receiver module comprise the same electrical signal receiver module.

47. The electronic apparatus of claim 34 wherein said first electrical signal source module and said second electrical signal source module share one or more components.

48. The electronic apparatus of claim 34 wherein said first electrical signal receiver module and said second electrical signal receiver module share one or more components.

49. The electronic apparatus of claim 34 wherein one or more intervening electrical elements exist between said first coupling position and said first electrical signal source module.

50. The electronic apparatus of claim 34 wherein one or more intervening electrical elements exist between said second coupling position and said first electrical signal receiver module.

51. The electronic apparatus of claim 34 wherein one or more intervening electrical elements exist between said third coupling position and said second electrical signal receiver module.

52. The electronic apparatus of claim 34 wherein one or more intervening electrical elements exist between said fourth coupling position and said second electrical signal source module.

53. The electronic apparatus of claim 34 wherein one or more of said first transmission line segments and one or more of said second transmission line are separated by one or more layers comprising an insulating layer selected from the group consisting of a solid material, a liquid material, a vacuum, gas, air, and a partial vacuum.

54. The electronic apparatus of claim 34 wherein said first transmission line structure and said second transmission line structure are elements of a module selected from the group consisting of an integrated circuit, a printed circuit board and a bond wire structure.

55. The electronic apparatus of claim 34 further comprising one or more reference voltage elements.

56. The electronic apparatus of claim 55 wherein one or more of said voltage elements are substantially in the same plane as one or more elements selected from the group consisting of one or more first transmission line segments and one or more second transmission line segments.

57. The electronic apparatus of claim 55 wherein one or more of said voltage elements are in a different plane from one or more elements selected from the group consisting of one or more first transmission line segments and one or more second transmission line segments.

58. A process for enhancing the inductance characteristics of transmission line pairs comprising:
  establishing a first transmission line structure comprising:
    one or more contiguous first transmission line segments;
    a first coupling position located substantially at the first end of said first transmission line structure for coupling to a first electrical signal source module and
    a second coupling position located substantially at the second end of said first transmission line for coupling to a first electrical signal receiver module;
  establishing a first electrical signal source module and coupling said first electrical signal source module to said first coupling position;
  establishing a first electrical signal receiver module and coupling said first electrical signal receiver module to said second coupling position;
  establishing a second transmission line structure comprising:
    one or more contiguous second transmission line segments wherein one or more of said first transmission line segments is substantially parallel to one or more of said second transmission line segments;
    a third coupling position located substantially at the first end of said second transmission line for coupling to a second electrical signal receiver module and
    a fourth coupling position located substantially at the second end of said second transmission line for coupling to a second electrical signal source module,
  wherein the first end of said first transmission line structure is adjacent to the first end of said second transmission line structure and the second end of said first transmission line structure is adjacent to the second end of said second transmission line structure;
  establishing a second electrical signal source module and coupling said second electrical signal source module to said fourth coupling position;
  establishing a second electrical signal receiver module and coupling said second electrical signal receiver module to said third coupling position;

whereby, when an electrical signal is applied across said first coupling position and said fourth coupling position,
  currents associated with the differential component of said electrical signal in one or more of said first transmission line segments and one or more of said second transmission line segments are substantially aligned and
  currents associated with the common mode component of said electrical signal in one or more of said first transmission line segments and one or more of said second transmission line segments are substantially counter-aligned.

59. The process of claim 58 further comprising the step of establishing an optional crossover structure coupled to said first transmission line structure and said second transmission line structure.

60. The process of claim 58 further comprising the step of establishing one or more reference voltage elements.

61. The process of claim 60 wherein one or more of said reference voltage elements are established in the same plane as one or more elements selected from the group consisting of one or more first transmission line segments and one or more second transmission line segments.

62. The process of claim 60 wherein one or more of said reference voltage elements are established in a different plane from one or more elements selected from the group consisting of one or more first transmission line segments and one or more second transmission line segments.

63. A system with enhanced inductance characteristics for differential transmission lines comprising one or more electronic elements coupled to a transmission line pair assembly in a counter coupled coplanar strip line configuration wherein said transmission line pair assembly comprises:
  a first transmission line structure comprising:
    one or more contiguous first transmission line segments;
    a first coupling position located substantially at the first end of said first transmission line structure for coupling to a first electrical signal source module and
    a second coupling position located substantially at the second end of said first transmission line structure for coupling to a first electrical signal receiver module and,
  a second transmission line structure adjacent to said first transmission line comprising:
    one or more contiguous second transmission line segments wherein one or more of said second transmission line segments are substantially parallel to one or more of said first transmission line segments;
    a third coupling position located substantially at the first end of said second transmission line structure and adjacent to said first end of said first transmission line structure for coupling to a second electrical signal receiver module and
    a fourth coupling position located substantially at the second end of said second transmission line structure and adjacent to said second end of said first transmission line structure for coupling to a second electrical signal source module;
  a first electrical signal source module coupled to said first transmission line at said first coupling position; a first electrical signal receiver module coupled to said first transmission line at said second coupling position;
  a second electrical signal receiver module coupled to said second transmission line at said third coupling position and a second electrical signal source module coupled to said second transmission line at said fourth coupling position, whereby, when an electrical signal is applied across said first coupling position and said fourth coupling position, currents associated with the differential component of said electrical signal in one or more of said first transmission line segments and one or more of said second transmission line segments are substantially aligned and currents associated with the common mode component of said electrical signal in one or more of said first transmission line segments and one or more of said second transmission line segments are substantially counter-aligned.

64. The system of claim 63 wherein said transmission line pair assembly further comprises a crossover structure.

65. The system of claim 63 further comprising one or more reference voltage elements.

66. The system of claim 65 wherein one or more of said reference voltage elements are established in the same plane as one or more elements selected from the group consisting of one or more first transmission line segments and one or more second transmission line segments.

67. The system of claim 65 wherein one or more of said reference voltage elements are established in a different plane from one or more elements selected from the group consisting of one or more first transmission line segments and one or more second transmission line segments.

* * * * *